US010432131B2

(12) United States Patent
Ito et al.

(10) Patent No.: US 10,432,131 B2
(45) Date of Patent: Oct. 1, 2019

(54) MOTOR DRIVE APPARATUS AND AIR CONDITIONER (71) Applicant: Mitsubishi Electric Corporation, Tokyo (JP)

(72) Inventors: Norikazu Ito, Tokyo (JP); Katsuhiko Saito, Tokyo (JP); Shigeo Umehara, Tokyo (JP); Katsuyuki Amano, Tokyo (JP); Masahiro Fukuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/073,910

(22) PCT Filed: Apr. 27, 2016

(86) PCT No.: PCT/JP2016/063146
§ 371 (c)(1),
(2) Date: Jul. 30, 2018

(87) PCT Pub. No.: WO2017/187542
PCT Pub. Date: Nov. 2, 2017

(65) Prior Publication Data
US 2019/0044469 A1 Feb. 7, 2019

(51) Int. Cl.
H02P 29/024 (2016.01)
H02P 27/08 (2006.01)
(Continued)

(52) U.S. Cl.
CPC .......... H02P 29/0241 (2016.02); H02M 1/08 (2013.01); H02M 1/088 (2013.01); H02M 1/32 (2013.01);
(Continued)

(58) Field of Classification Search
CPC ............ H02M 1/08; H02M 1/32; H02M 3/07; H02M 1/088; H02M 7/5387; H02M 7/53871; H02P 27/08; H02P 29/0241
See application file for complete search history.

(56) References Cited

U.S. PATENT DOCUMENTS 4,002,958 A * 1/1977 Akamatsu ............. H02M 7/527
323/271
4,642,751 A * 2/1987 Schauder .............. H02M 5/271
363/159

(Continued)

FOREIGN PATENT DOCUMENTS

DE 10 2014 211 462 A1 2/2015
EP 2 597 767 A2 5/2013

(Continued)

OTHER PUBLICATIONS

Extended EP Search Report ("EESR") dated Nov. 22, 2017 issued in corresponding EP patent application No. 16863193.5.

(Continued)

Primary Examiner — Thai T Dinh
(74) Attorney, Agent, or Firm — Posz Law Group, PLC (57) ABSTRACT There are provided the same number of inverter modules as the number of phases of a motor, and an inverter control unit that generates PWM signals used to drive the inverter modules in PWM. Three phase outputs from each of the inverter modules are coupled to form a phase output signal for one phase of the motor while capacitors are mounted between control GNDs of the inverter modules and power GNDs of the inverter modules. Consequently, even if a surge voltage is generated in a GND wiring at the time of a switching operation of switching elements in the inverter modules, the application of the surge voltage to the switching elements can be suppressed.

9 Claims, 7 Drawing Sheets (51) Int. Cl.
*H02M 1/08* (2006.01)
*H02M 7/5387* (2007.01)
*H02M 1/32* (2007.01)
*H02M 1/088* (2006.01)
*H03K 17/12* (2006.01)
*H03K 17/16* (2006.01)

(52) U.S. Cl.
CPC ..... *H02M 7/5387* (2013.01); *H02M 7/53871* (2013.01); *H02P 27/08* (2013.01); *H03K 17/127* (2013.01); *H03K 17/161* (2013.01)

(56) References Cited

U.S. PATENT DOCUMENTS

| | | | | |
|---|---|---|---|---|
| 4,713,745 A | * | 12/1987 | Schauder | H02M 5/271 318/809 |
| 5,182,508 A | * | 1/1993 | Schauder | B60L 3/0046 318/801 |
| 7,538,587 B2 | | 5/2009 | Iwagami et al. | |
| 8,884,560 B2 | | 11/2014 | Ito | |
| 8,941,347 B2 | * | 1/2015 | Otorii | H02M 1/4225 318/722 |

FOREIGN PATENT DOCUMENTS

| | | |
|---|---|---|
| JP | 2003-088098 A | 3/2003 |
| JP | 2006-166691 A | 6/2006 |
| JP | 2008-277433 A | 11/2008 |
| JP | 2009-261106 A | 11/2009 |
| JP | 2012-210153 A | 10/2012 |
| JP | 2013-062904 A | 4/2013 |
| JP | 2015-033222 A | 2/2015 |

OTHER PUBLICATIONS

International Search Report dated Jul. 19, 2016 issued in corresponding international patent application No. PCT/JP2016/063146.
Office action dated May 7, 2019 issued in corresponding JP patent application No. 2018-514009 (and English translation thereof).
Office Action dated Feb. 20, 2019 issued in corresponding AU patent application No. 2016404961.

\* cited by examiner

MOTOR DRIVE APPARATUS AND AIR CONDITIONER

CROSS REFERENCE TO RELATED APPLICATION

This application is a U.S. national stage application of International Patent Application No. PCT/JP2016/063146 filed on Apr. 27, 2016, the disclosure of which is incorporated herein by reference.

TECHNICAL FIELD

The present invention relates to a motor drive apparatus that uses inverter modules including switching elements, and to an air conditioner equipped with the motor drive apparatus.

BACKGROUND

There is a motor drive apparatus that uses an inverter module including switching elements (for example, see Patent Literature 1), in which a high withstand voltage diode is additionally connected between a power supply terminal of a gate drive circuit and a drive power supply in order to prevent a breakdown of a peripheral circuit (a control power supply circuit or a control circuit such as a microcomputer) caused by a surge voltage generated at the time of switching of the switching elements used in the inverter module.

There is an inverter module capable of driving a three-phase motor (for example, see Patent Literature 2) including switching elements for upper and lower arms, and an upper arm gate drive circuit and a lower arm gate drive circuit, which drive these switching elements, and including low potential power supply terminals (NU, NV, NW) connected to the switching elements for the lower arm, and a low potential power supply terminal (VNC) for driving lower arm gates, connected to the lower arm gate drive circuit.

Moreover, there is a power converter (for example, see Patent Literature 3) including inverter modules each allocated to a U phase, a V phase, and a W phase to drive switching elements set in each inverter module by use of a common drive signal.

PATENT LITERATURE

Patent Literature 1: Japanese Patent Application Laid-Open No. 2006-166691
Patent Literature 2: Japanese Patent Application Laid-Open No. 2008-277433
Patent Literature 3: Japanese Patent Application Laid-Open No. 2009-261106

According to the motor drive apparatus disclosed in Patent Literature 1, the high withstand voltage diode is connected between the power supply terminal of the gate drive circuit and the power supply, thereby to be able to suppress an overvoltage breakdown in the peripheral circuit, caused by the surge voltage generated inside and outside the inverter module. However, but an overvoltage for the gate drive circuit itself inside the inverter modules cannot be suppressed, so that the switching elements inside the inverter module possibly break down when an overvoltage exceeding an allowable voltage is applied to the gate drive circuit.

When three inverter modules are connected in parallel as in Patent Literature 3 (FIG. 6) in order to compose an inverter adapted for high current, the low potential power supply terminals (NU, NV, NW) connected to the switching elements for the lower arm and the low potential power supply terminal (VNC) for driving the lower arm gate, connected to the lower arm gate drive circuit, as illustrated in Patent Literature 2 need to be mutually connected among the plural inverter modules, and thereby a problem is raised in that a wiring pattern on a circuit board on which the modules are mounted is adversely increased in length. Because a wiring inductance increases as the wiring pattern on the circuit board is increased in length, the surge voltage generated at the time of switching (turning on and turning off) of the switching elements of the inverter modules is increased.

Moreover, the parallel connection of the three inverter modules can triple the current capacity per phase, so that this increase in current capacity also causes an increase in surge voltage caused by the wiring inductance.

Furthermore, in order to speed up the operation of the inverter, the switching elements in the inverter modules can be made from a wide bandgap semiconductor such as silicon carbide (SiC), gallium nitride (GaN) or diamond. In this case, a current changing rate (di/dt) becomes larger thereby to cause a further increase in surge voltage induced by the wiring inductance. As the switching operation is sped up, the conventional appropriation of a components layout and wiring patterns on an electronic substrate cannot fully ensure protection of the inverter modules against that surge voltage.

The increase in surge voltage as described above results in an increased possibility of causing a malfunction and/or a failure in the switching elements and/or the gate drive circuit in the inverter modules.

SUMMARY

The present invention has been made in order to solve the aforementioned problems. A first object of the present invention is to provide a motor drive apparatus configured to have an inverter unit constructed of a number of inverter modules connected in parallel, and to be capable of reducing the occurrence of a malfunction and/or a failure in the inverter modules due to the surge voltage generated inside or outside the inverter modules. A second object of the present invention is to provide an air conditioner equipped with the motor drive apparatus configured to be able to reduce the occurrence of the malfunction and/or the failure in the inverter modules, caused by the surge voltage.

The present invention provides a motor drive apparatus comprising the same number of inverter modules as the number of phases of a motor, the inverter modules each including: a plurality of switching element pairs having switching elements for an upper arm and switching elements for a lower arm, which are connected in series; a lower arm gate drive circuit to drive the switching elements for the lower arm; power ground terminals of the switching elements for the lower arm; and a control ground terminal of the lower arm gate drive circuit, wherein a surge suppression element to suppress a surge voltage generated at the time of switching of the switching elements is implemented between the power ground terminals and the control ground terminal of the inverter module.

According to the motor drive apparatus of the present invention, even if a surge voltage is generated at the time of switching of the switching elements in the inverter module, the surge voltage can be suppressed by the surge suppression elements, thereby making it possible to suppress application of the surge voltage to the switching elements. By so doing, it is possible to reduce the occurrence of the malfunction and/or the failure in the switching elements in the inverter modules, and thus to provide the motor drive apparatus capable of safer and stable operations.

DETAILED DESCRIPTION

First Embodiment

Figure 1:
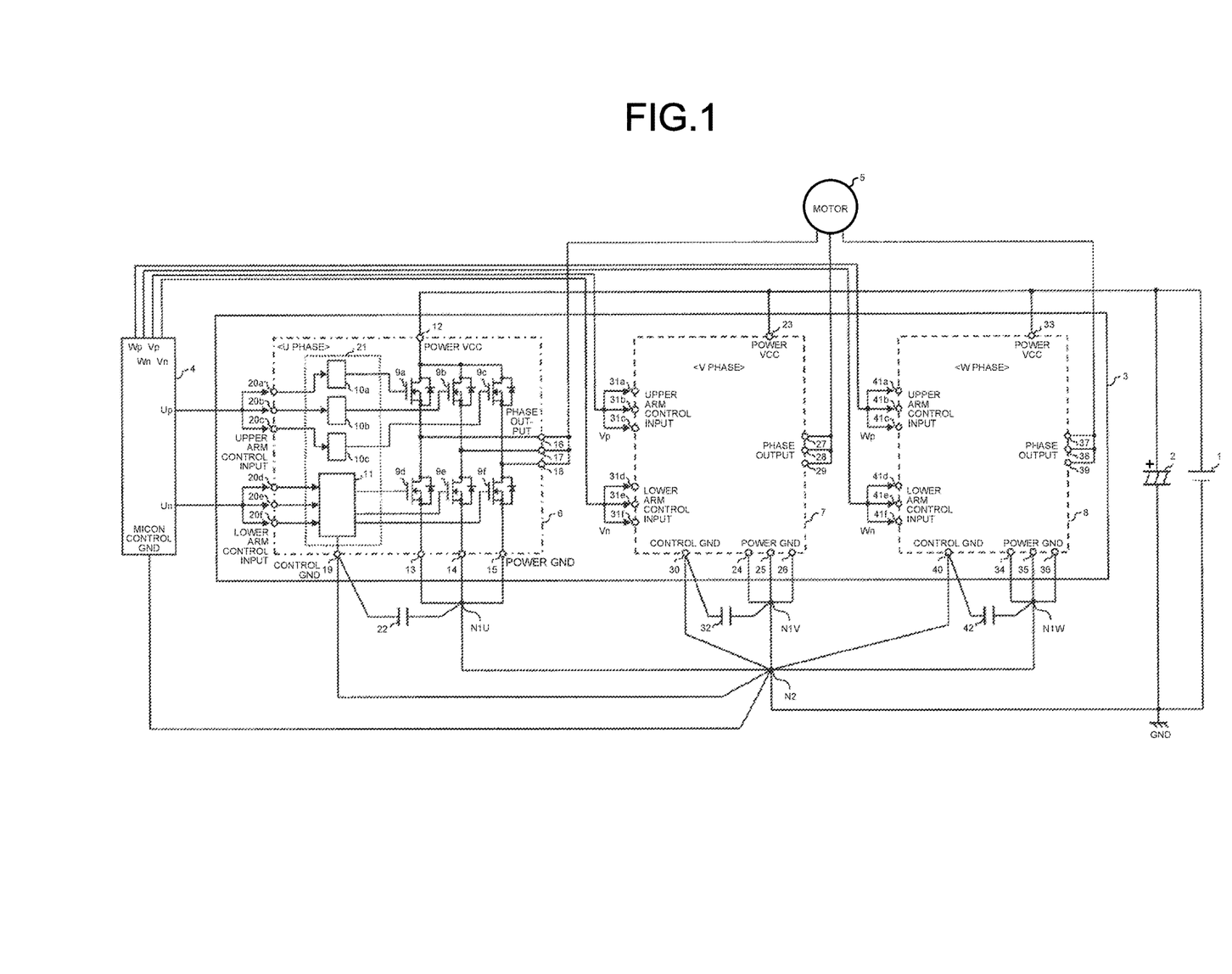
FIG. 1 is a diagram illustrating a system configuration including a motor drive apparatus according to a first embodiment.

The configuration and operation of a motor drive apparatus according to a first embodiment will be described with reference to the drawings. FIG. 1 illustrates a system configuration including the motor drive apparatus of the present embodiment. The present system is composed of a DC voltage source 1, a smoothing capacitor 2 that reduces a ripple in a DC voltage, an inverter unit 3 that converts DC power into three-phase AC power, an inverter control unit 4 that performs PWM control on switching elements in the inverter unit 3, and a three-phase motor 5 that is an electric motor driven by three-phase power outputted from the inverter unit 3.

The DC voltage source 1 may be constructed of a converter device or converter devices generating DC power from AC power, or may be a battery having a DC power output such as a storage cell. An electrolytic capacitor can be employed as the smoothing capacitor 2. Note that the PWM control performed by the inverter control unit 4 refers to on/off control on the switching elements in the inverter unit 3 in pulse width modulation, and will be described in detail later on.

The inverter unit 3 is composed of an inverter module 6 corresponding to a U phase, an inverter module 7 corresponding to a V phase, and an inverter module 8 corresponding to a W phase. The number of phases of the three-phase motor 5 that is an electrical motor is "3" in the present embodiment, and thus the number of inverter modules is also three which is equal in number to the phases of the motor. Since the inverter modules 6, 7, and 8 are configured in the same manner, a configuration of the inverter module 6 will be described first below.

The inverter module 6 has switching elements 9a, 9b, and 9c constituting an upper arm, switching elements 9d, 9e, and 9f constituting a lower arm, upper arm gate drive circuits 10a, 10b, and 10c driving the switching elements 9a, 9b, and 9c of the upper arm, respectively, and a lower arm gate drive circuit 11 driving the switching elements 9d, 9e, and 9f of the lower arm, which are built in the module 6. The switching element 9a in the upper arm and the switching element 9d in the lower arm are connected in series to form a switching element pair, and this switching element pair is connected between a power supply terminal (also expressed as a power VCC) 12 and a power ground terminal (also expressed as a power GND) 13. Likewise, the switching elements 9b and 9e, and the switching elements 9c and 9f form their respective switching element pairs, in which the switching element pair formed of the switching elements 9b and 9e is connected between the power supply terminal 12 and a power ground terminal 14, and the switching element pair formed of the switching elements 9c and 9f is connected between the power supply terminal 12 and a power ground terminal 15. An interconnection point of the switching element 9a in the upper arm and the switching element 9d in the lower arm is connected to a phase output terminal 16. Likewise, interconnection points of the switching elements 9b and 9e, and the switching elements 9c and 9f are connected to phase output terminals 17 and 18, respectively. Phase output signals from the phase output terminals 16, 17, and 18 are coupled outside the inverter module 6, and outputted to the motor 5 as a U-phase output signal that is a phase output signal for one phase of the motor 5. The power supply terminal 12 is connected to a positive terminal of the smoothing capacitor 2. The power ground terminals 13, 14, and 15 are connected at a single connection point (N1U) outside the inverter module 6. The single connection point (N1U) is desirably provided as close to the inverter module 6 as possible. The lower arm gate drive circuit 11 has a control ground terminal (also expressed as a control GND) 19. A capacitor 22 is mounted between the control GND 19 of the inverter module 6 and the single connection point (N1U). The capacitor 22 functions as a surge suppression element suppressing a surge voltage that is generated at the time of switching of the switching elements 9a to 9f, as described later. The capacitor 22 is preferably mounted as close to the inverter module 6 as possible.

The upper arm gate drive circuit 10a is connected to an upper arm control input terminal 20a and a gate of the switching element 9a in the upper arm, and outputs a gate drive signal to drive the gate of the switching element 9a in the upper arm on the basis of a PWM signal inputted from the upper arm control input terminal 20a. Likewise, the upper arm gate drive circuits 10b and 10c output their respective gate drive signals to drive gates of the switching elements 9b and 9c in the upper arm on the basis of PWM signals inputted from upper arm control input terminals 20b and 20c, respectively.

The lower arm gate drive circuit 11 is connected to lower arm control input terminals 20d, 20e, and 20f and gates of the switching elements 9d, 9e, and 9f in the lower arm, and outputs gate drive signals to drive the gates of the switching elements 9d, 9e, and 9f in the lower arm on the basis of PWM signals inputted from the lower arm control input terminals 20d, 20e, and 20f. Note that the upper arm gate drive circuits 10a, 10b, and 10c, and the lower arm gate drive circuit 11 together make up a drive control unit 21.

As each of the switching elements 9a to 9f in the upper and lower arms, a switching element such as a MOSFET or an IGBT may be used, but also a switching element made from a wide bandgap semiconductor such as gallium nitride (GaN), silicon carbide (SiC) or diamond can be used. The use of the wide bandgap semiconductor increases allowable current density to be able to reduce the chip size and thus the size of the inverter modules 6, 7, and 8. Heat dissipating fins may also be employed to dissipate heat from the inverter modules 6, 7, and 8, and in that case, the heat dissipating fins can be reduced in size since the wide bandgap semiconductor has high heat resistance, a high switching speed, and a small loss caused by switching. The following description is based on an assumption that the switching elements 9a to 9f are MOSFETs.

The inverter control unit 4 has a function of performing variable speed control of the motor 5, and outputs PWM signals to control the driving of the inverter unit 3. Specifically, the inverter control unit generates PWM signals Up, Vp, Wp, Un, Vn, and Wn used to control an on/off state of the switching elements for each phase and arm, and outputs the signals to the inverter unit 3. The signals Up, Vp, and Wp are the PWM signals used to control the on/off state of the switching elements in the upper arm of the U, V, and W phases, while the signals Un, Vn, and Wn are the PWM signals used to control the on/off state of the switching elements in the lower arm of the U, V, and W phases. Here, the PWM signal is a pulsed signal that has either a high value indicating an on state (or closed state) of the switching element or a low value indicating an off state (or opened state) of the switching element. A width of a period during which the on state of the PWM signal continues is called a pulse width.

The PWM signal Up outputted by the inverter control unit 4 is inputted to the upper arm control input terminals 20a, 20b, and 20c of the inverter module 6. The PWM signal Un outputted by the inverter control unit 4 is inputted to the lower arm control input terminals 20d, 20e, and 20f of the inverter module 6. That is, three replications of the PWM signal Up outputted from the inverter control unit 4 are inputted to the upper arm control input terminals 20a, 20b, and 20c, respectively. Moreover, three replications of the PWM signal Un outputted from the inverter control unit 4 are inputted to the lower arm control input terminals 20d, 20e, and 20f, respectively. This allows the three switching elements 9a, 9b, and 9c making up the upper arm of the inverter module 6 to perform a switching operation on the basis of one and the same drive signal (PWM signal Up), and allows the three switching elements 9d, 9e, and 9f making up the lower arm of the inverter module 6 to perform a switching operation on the basis of one and the same drive signal (PWM signal Un). The inverter control unit 4 can be formed of a control microcomputer. The inverter control unit 4 has a ground reference (also expressed as a micon control GND) as a potential reference.

While the connection configuration of the inverter module 6 has been described, the inverter modules 7 and 8 each have a similar connection configuration. Specifically, the PWM signal Vp outputted by the inverter control unit 4 is inputted to upper arm control input terminals 31a, 31b, and 31c of the inverter module 7, while the PWM signal Vn is inputted to lower arm control input terminals 31d, 31e, and 31f of the inverter module 7. This allows the three switching elements making up the upper arm of the inverter module 7 to perform a switching operation on the basis of one and the same drive signal (PWM signal Vp), and allows the three switching elements making up the lower arm of the inverter module 7 to perform a switching operation on the basis of one and the same drive signal (PWM signal Vn).

Phase output signals from phase output terminals 27, 28, and 29 of the inverter module 7 are coupled outside the inverter module 7, and outputted to the motor 5 as a V-phase output signal that is a phase output signal for one phase of the motor 5. A power supply terminal 23 is connected to the positive terminal of the smoothing capacitor 2, while power ground terminals 24, 25, and 26 are connected at a single connection point (N1V) outside the inverter module 7. The single connection point (N1V) is desirably provided as close to the inverter module 7 as possible. The inverter module 7 also has a control ground terminal (also expressed as a control GND) 30 for the lower arm gate drive circuit. A capacitor 32 as a surge suppression element is connected between the control GND 30 of the inverter module 7 and the single connection point (N1V). The capacitor 32 is preferably mounted as close to the inverter module 7 as possible.

The PWM signal Wp outputted by the inverter control unit 4 is inputted to upper arm control input terminals 41a, 41b, and 41c of the inverter module 8, while the PWM signal Wn is inputted to lower arm control input terminals 41d, 41e, and 41f of the inverter module 8. Phase output signals from phase output terminals 37, 38, and 39 of the inverter module 8 are coupled outside the inverter module 8, and outputted to the motor 5 as a W-phase output signal that is a phase output signal for one phase of the motor 5. This allows the three switching elements making up the upper arm of the inverter module 8 to perform a switching operation on the basis of one and the same drive signal (PWM signal Wp), and allows the three switching elements making up the lower arm of the inverter module 8 to perform a switching operation on the basis of one and the same drive signal (PWM signal Wn).

Phase output signals from the phase output terminals 37, 38, and 39 of the inverter module 8 are coupled outside the inverter module 8, and outputted to the motor 5 as the W-phase output signal. A power supply terminal 33 is connected to the positive terminal of the smoothing capacitor 2, while power ground terminals 34, 35, and 36 are connected at a single connection point (N1W) outside the inverter module 8. The single connection point (N1W) is desirably provided as close to the inverter module 8 as possible. The inverter module 8 also has a control ground terminal (also expressed as control GND) 40 for the lower arm gate drive circuit. A capacitor 42 as a surge suppression element is connected between the control GND 40 of the inverter module 8 and the single connection point (N1W). The capacitor 42 is preferably mounted as close to the inverter module 8 as possible.

Note that the three single connection points (N1U, N1V, and N1W) will also be expressed as a single connection point (N1) when description is given without distinguishing among the three points.

The GND connection of the inverter modules 6, 7, and 8, and the inverter control unit 4 will now be described. The three single connection points (N1s) that connect the power GNDs of their respective inverter modules 6, 7, and 8 in a single point connection, the control GNDs 19, 30, and 40 of the inverter modules 6, 7, and 8, and the micon control GND of the inverter control unit 4 are connected at a single connection point (N2) through wiring. The single connection point (N2) is also connected to a negative terminal of the smoothing capacitor 2, and the negative terminal of the smoothing capacitor 2 is grounded (GND).

Moreover, as described previously, the capacitor 22 is connected between the control GND 19 of the inverter module 6 and the single connection point (N1U). Likewise, the capacitors 32 and 42 are connected between the control GND 30 of the inverter module 7 and the single connection point (N1V) and between the control GND 40 of the inverter module 8 and the single connection point (N1W), respectively. The capacitors 22, 32, and 42 are preferably mounted as close to the inverter modules 6, 7, and 8 as possible, respectively.

A setting location of the single connection point (N2) may be determined as appropriate in consideration of a requirement to reduce as much as possible a sum of lengths of the wirings respectively connecting the three single connection points (N1s) provided near the inverter modules 6, 7, and 8, and the single connection point (N2), and a requirement to reduce a substrate mounting area determined by mounting of components including the inverter modules 6, 7, and 8, and layout of the wiring pattern.

Next, the operation of the motor drive apparatus configured as described above will be described. One arm for a phase of the inverter unit 3 is constituted by the three switching elements connected in parallel. For this reason, the inverter control unit 4 determines the pulse width of the PWM signal according to a current flowing when the three switching elements are all turned on. In other words, the PWM signal is generated while the three switching elements are treated as one switching element with a high current capacity.

Note that the inverter control unit 4 may generate the PWM signal based on an operation command from an upper-level control microcomputer (not shown) for the operation of the motor, based on a value detected by a current detector (not shown) detecting a motor current of the motor 5, or based on the like, but a detailed description will be omitted as it is a publicly known technique.

Here, a feature of the inverter control unit 4 according to the present embodiment will be described in contrast to a conventional general inverter driving a three-phase motor. The conventional general inverter has been composed of, for each phase, a switching element pair made up of one switching element for an upper arm and one switching element for a lower arm that are connected in series, thereby to drive a three-phase motor. Therefore, the inverter as a whole includes a total of three switching element pairs (or six switching elements) for three phases. Here, the inverter with such a conventional configuration will be called a "single pair inverter".

In general, in the case where switching elements are implemented as a semiconductor chip, increase in the chip area causes a reduction in the yield when the chip is taken from a wafer, whereas decrease in the chip area can improve the yield. Since the cost of the wafer is increased particularly when SiC is used for the switching elements, it is desirable to reduce the chip area in order to achieve reduction in cost. However, since the reduction in the chip area causes a reduction in current capacity, it is difficult to achieve both the reduction in cost and the increase in current capacity when the single pair inverter is constituted by one inverter module.

On the other hand, according to the present embodiment, the current capacity per phase can be increased by connecting the switching elements in parallel for each phase as illustrated in FIG. 1 (parallel connection for the upper arm formed of the switching elements 9a to 9c, and parallel connection for the lower arm formed of the switching elements 9d to 9f), even when the current capacity of each of the switching elements 9a to 9f is small. Specifically, assuming a current capacity of one switching element is represented as A amperes, the current capacity per phase in the single pair inverter is A amperes since the upper arm in a phase is formed by one switching element and the lower arm in a phase is formed by one switching element. In contrast, in the present embodiment, the current capacity per phase is ideally 3×A amperes since the upper arm in a phase is formed by three switching elements and the lower arm in a phase is formed by three switching elements, by virtue of the parallel connection of the three switching elements. The present embodiment can provide a configuration of an inverter adapted to high current capacity while its current capacity per phase being tripled, by use of a number of inverter modules with the same specifications. Moreover, the inverter modules can be manufactured in large quantities at low cost by communalizing an inverter module for the single pair inverter and the inverter modules 6, 7, and 8 of the present embodiment. As a result, it is possible to realize both reduction in cost and increase in current capacity for motor drive apparatuses including inverters.

The single pair inverter and the inverter of the present embodiment can be applied to a household air conditioner and an industrial air conditioner, for example. The household air conditioner requiring an inverter with a low current capacity may be configured to include a single pair inverter using one inverter module, whereas the industrial air conditioner requiring an inverter with a high current capacity may be configured to include an inverter using three inverter modules as illustrated in FIG. 1. By so doing, inverter modules can be shared between the household air conditioner and the industrial air conditioner, and thus it is possible to reduce costs, and at the same time to achieve adaptation to higher current capacity and reduction in cost for the industrial air conditioner.

Figure 2:
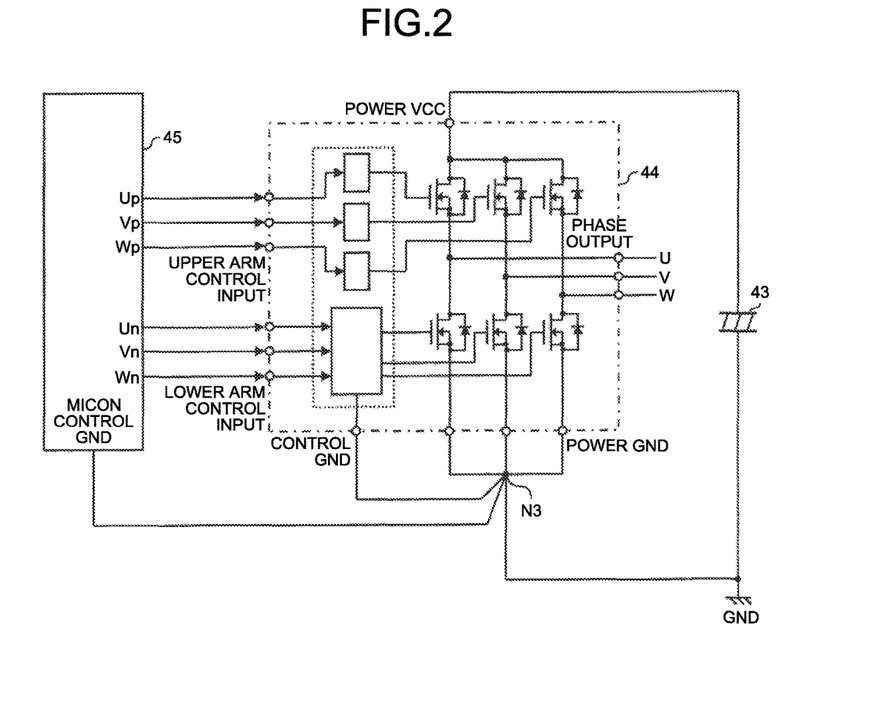
FIG. 2 is a diagram illustrating a configuration of a conventional single pair inverter.

There will now be described a reason why the capacitors 22, 32, and 42 are provided between the control GNDs 19, 30, and 40 of the inverter modules 6, 7, and 8 and the single connection points (N1U, N1V, and N1W), respectively, in the present embodiment. For the purpose of comparison, FIG. 2 illustrates a configuration of principal parts of a motor drive apparatus composed of a single pair inverter. The motor drive apparatus in FIG. 2 is composed of a smoothing capacitor 43 that reduces a ripple contained in a DC voltage source output, an inverter module 44, and an inverter control unit 45 that performs PWM control on switching elements in the inverter module 44. Three phase output signals from the inverter module 44 are inputted to U, V, and W terminals of a motor, respectively. The inverter module 44 has the same configuration as the inverter module 6, 7, or 8 in FIG. 1 and thus will not be described in detail.

Power GNDs and a control GND of the inverter module 44, and a micon control GND of the inverter control unit 45 are connected at a single connection point (N3), and further this single connection point (N3) is connected to a negative terminal of the smoothing capacitor 43. The negative terminal of the smoothing capacitor 43 is grounded (GND).

The motor drive apparatus with the configuration illustrated in FIG. 2 employs only one inverter module, so that the smoothing capacitor 43, the inverter module 44, and the inverter control unit 45 can be mounted in proximity to one another on a substrate, thereby making it possible to reduce wiring lengths of the patterns between elements. Moreover, its motor current can flow only within a current capacity of one inverter module, and so the motor current is as small as one third of a motor current flowing in the motor drive apparatus illustrated in FIG. 1. For this reason, even when the inverter module 44 is made from a wide bandgap semiconductor with a high switching speed, a small surge voltage is generated as an induced voltage by a parasitic inductance component owned by wiring patterns among the elements and a lead frame inside the inverter module at the time of a switching operation of the switching elements in the inverter module 44, so that no problem has been raised in driving the motor.

On the other hand, when the motor drive apparatus is formed of the three inverter modules 6, 7, and 8 connected in parallel as illustrated in FIG. 1, the wiring patterns among the elements in the substrate mounting is adversely increased in length. For this reason, a wiring inductance in the GND wiring between the power GNDs of the inverter modules 6, 7, and 8, and the negative terminal of the smoothing capacitor 2 is higher as compared to the case of the motor drive apparatus formed of the single inverter module as illustrated in FIG. 2, thereby causing an increase in possible induced voltage caused by the parasitic inductance of the wiring.

When the switching elements made from the wide bandgap semiconductor are employed as the switching elements in the inverter modules 6, 7, and 8, the switching speed of the switching elements is higher than when the switching elements are made from a silicon (Si) semiconductor material. For this reason, a rate of change of the current flowing through the lead frame inside the inverter modules and wiring patterns outside the inverter modules is increased, thereby to result in a further increase in the induced voltage caused by the parasitic inductance of the wiring patterns and the lead frame.

Figure 3:
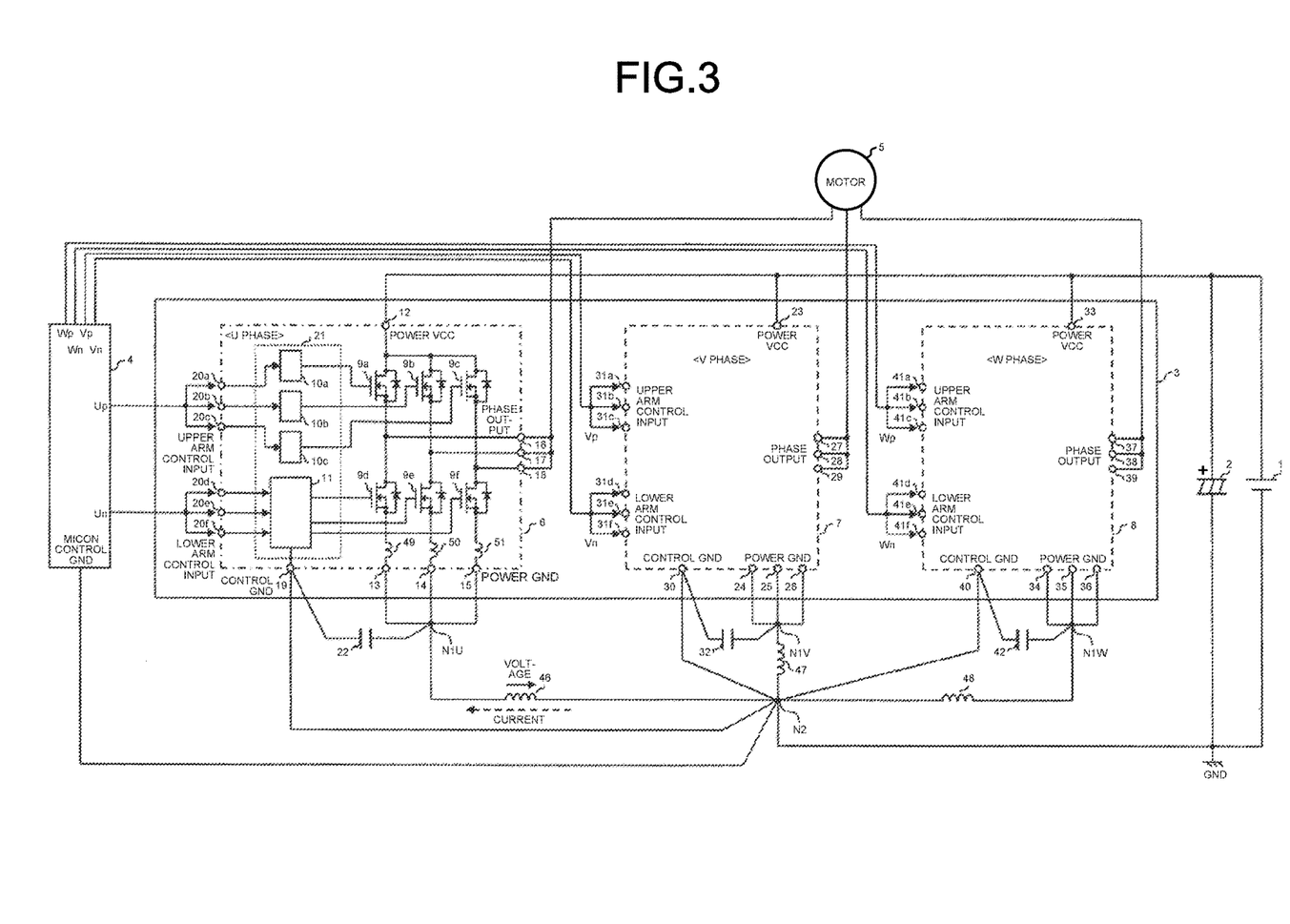
FIG. 3 is a diagram provided to describe a circuit operation of the motor drive apparatus according to the first embodiment.

The circuit operation performed at the time of occurrence of the surge voltage will be described below. FIG. 3 is a diagram clearly indicating the wiring inductance outside the inverter modules and the parasitic inductance of the lead frame inside the inverter modules. Specifically, a parasitic inductance 46 exists in a wiring pattern connecting the single connection point (N1U) and the single connection point (N2). Likewise, a parasitic inductance 47 and a parasitic inductance 48 exist in a wiring between the single connection point (N1V) and the single connection point (N2) and a wiring between the single connection point (N1W) and the single connection point (N2), respectively. Parasitic inductances 49, 50, and 51 of the lead frame exist between the switching elements 9d to 9f in the lower arm and the power GND terminals 13, 14, and 15 in the inverter module 6, respectively. Note that a parasitic inductance of the lead frame inside the inverter module is generally smaller than a parasitic inductance of the wiring outside the inverter module, and accordingly in the circuit operation to be described below, there is no problem even if the existence of the parasitic inductances 49, 50, and 51 of the lead frame is ignored. Parasitic inductances of wirings and the lead frames also exist at other locations than those described above, but are omitted from the figures in the following description of the operation since such inductances have little influence on the operation.

An example of a timing at which an induced voltage is generated will be described. As the switching elements 9a to 9c in the upper arm of the inverter module 6 are switched from an on state to an off state, the motor current flowing in a direction of the phase output from the switching elements 9a to 9c is commutated to the switching elements 9d to 9f in the lower arm. At the time of the commutation, an induced voltage determined by a product (L·di/dt) of the inductance and the current changing rate is generated in the parasitic inductance 46 in a direction opposite to a direction of the current. This induced voltage is generated as a transient overvoltage at the time of the commutation. FIG. 3 illustrates the direction of the commutated current and the direction of a potential of the induced voltage.

In the present embodiment where the three inverter modules 6, 7, and 8 connected in parallel are mounted and laid out on the substrate, the GND patterns connected to the inverter modules are required to be longer. This causes an increase in the parasitic inductance of the wirings as well as a higher induced voltage due to the parasitic inductance of the wirings than when the motor drive apparatus is formed of the single pair inverter.

Note that some wiring pattern is usually used as the wiring outside the inverter module, but such wiring pattern does not mean limitation to be imposed, and a jumper lead is also used in some cases to establish the connection when there is a constraint on mounting and layout for components. In this case, the use of the jumper lead results in a higher parasitic inductance than when only wiring patterns are used for the wiring.

Figure 4:
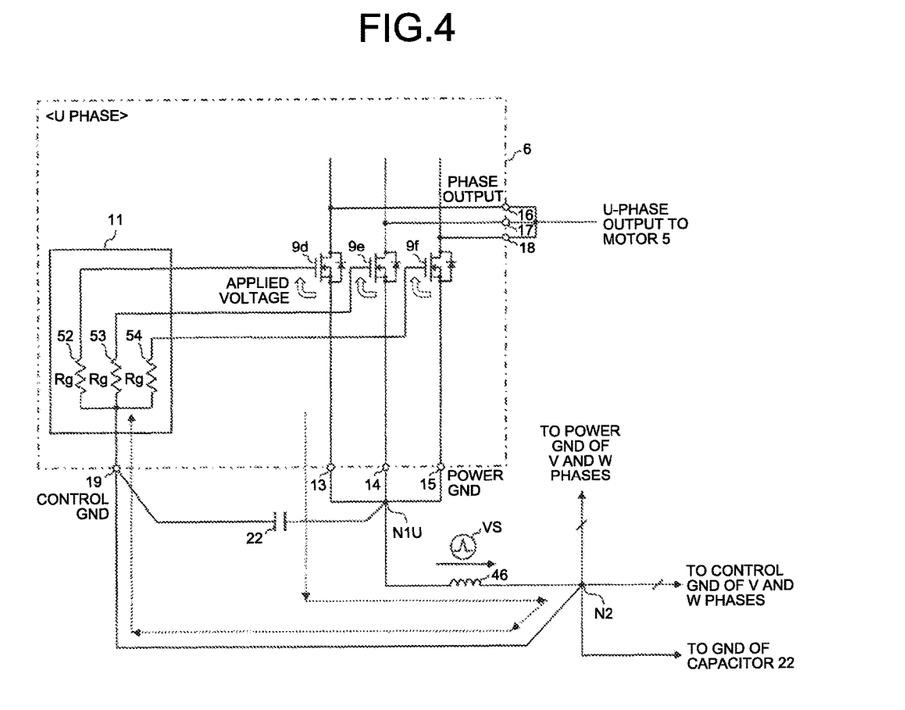
FIG. 4 is a diagram provided to describe a circuit operation of the motor drive apparatus according to the first embodiment.

FIG. 4 is a partial drawing of the configuration illustrated in FIG. 3, and illustrates a circuit configuration including the switching elements 9d to 9f in the lower arm of the inverter module 6 for the U phase. In FIG. 4, the lower arm gate drive circuit 11 is illustrated as an equivalent circuit using internal resistances Rg 52, 53, and 54.

An induced voltage VS generated in the parasitic inductance 46 of the wiring is applied between gates and sources of the switching elements 9d to 9f in the lower arm along a path (the induced voltage source VS→the single connection point (N2)→the control GND 19→the internal resistances Rg 52, 53, and 54→the switching elements 9d to 9f) indicated by a dotted line in FIG. 4. In general, a switching element possibly breaks down when a voltage higher than or equal to a gate withstand voltage for the switching element is applied between the gate and the source of the element. In particular, a switching element made from a SiC semiconductor material has a lower gate withstand voltage than a switching element made from a Si semiconductor material, and thus has a requirement not to apply an overvoltage to the switching element.

In the present embodiment, the capacitor 22 is mounted between the control GND 19 of the inverter module 6 and the single connection point (N1U) of the power GNDs to form a closed circuit including the induced voltage source VS (the induced voltage source VS→the single connection point (N2)→the control GND 19→the capacitor 22→the single connection point (N1U)→the induced voltage source VS), whereby a surge voltage applied between the gates and the sources of the switching elements 9d to 9f can be suppressed. Note that the surge voltage applied between the gates and the sources of the switching elements can be further suppressed by mounting the capacitor 22 as close to the inverter module 6 as possible.

The capacitors 32 and 42 provided near the inverter modules 7 and 8 each have a function similar to that of the capacitor 22, whereby the surge voltage applied between the gates and the sources of the switching elements in the lower arm can be reduced, by virtue of the induced voltage caused by the wiring inductance at the time of the on/off operation of the switching elements in the inverter modules 7 and 8.

Note that while a motor to be driven is the three-phase motor 5 in the aforementioned, a motor with a different number of phases (M phases) may be used instead, and in that case, one can extend the configuration to a configuration using M inverter modules.

As described above, the motor drive apparatus of the present embodiment includes the same number of inverter modules 6, 7, and 8 as the number of phases of the motor, and the inverter control unit 4 that generates the PWM signals used to drive the inverter modules in PWM. The three phase outputs from each of the inverter modules are coupled and outputted as the phase output signal for one phase of the motor, while at the same time the capacitors 22, 32, and 42 are mounted between the control GNDs of the inverter modules 6, 7, and 8, and the power GNDs of the inverter modules. By doing so, even if a surge voltage is generated in the GND wiring at the time of the switching operation of the switching elements 9a to 9f in the inverter modules, the application of the surge voltage to the switching elements 9d can be suppressed, thereby to make it possible to obtain the effect that the occurrence of a failure and/or a malfunction of the switching elements in the inverter modules can be reduced. Then, such a possibility to reduce the occurrence of the failure and/or the malfunction of the inverter modules can provide the motor drive apparatus capable of performing safer and more stable operations even at the time of a high current operation using a plurality of inverter modules.

Second Embodiment

Figure 5:
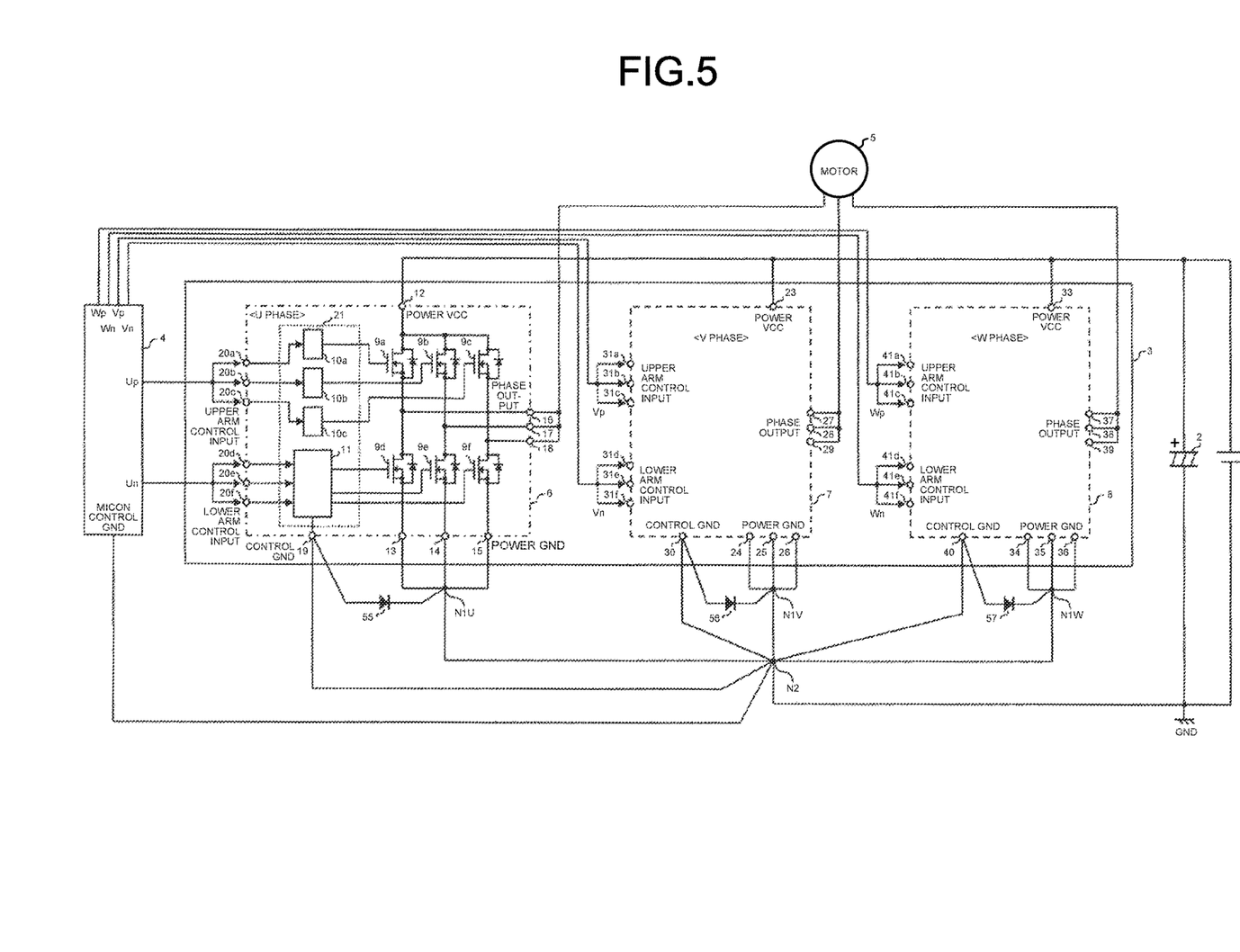
FIG. 5 is a diagram illustrating a system configuration including a motor drive apparatus according to a second embodiment.

The configuration and operation of a motor drive apparatus according to a second embodiment will be described with reference to the drawings. In the first embodiment, the capacitors 22, 32, and 42 are connected between the control GNDs and the power GNDs of the inverter modules, whereas in the present embodiment, diodes are implemented as surge suppression elements instead of the capacitors.

FIG. 5 illustrates a system configuration including a motor drive apparatus according to the present embodiment. In FIG. 5, a part identical or corresponding to a part in FIG. 1 will be assigned the same reference sign as that assigned to the part in FIG. 1. In the following, what is different from the first embodiment will mainly be described.

In the present system, a diode 55 as a surge suppression element is mounted between the control GND 19 of the inverter module 6 and the single connection point (N1U). Specifically, an anode of the diode 55 is connected to the control GND 19, and a cathode of the diode 55 is connected to the single connection point (N1U). Likewise, as for the inverter modules 7 and 8, diodes 56 and 57 as surge suppression elements are connected between the control GNDs 30 and 40 of the inverter modules and the single connection points (N1V and N1W), respectively. The diodes 55, 56, and 57 are preferably mounted as close to the corresponding inverter modules as possible.

The operation will now be described. Even in the event that an induced voltage is generated in a parasitic inductance of the wiring between the single connection point (N1U) and the single connection point (N2) in a commutation operation according to change in on/off states of the switching elements in the inverter module 6, a voltage between the control GND 19 and the single connection point (N1U) is constricted by a forward voltage (VF) of the diode 55. Accordingly, a surge voltage applied between gates and sources of the switching elements 9d to 9f in the lower arm of the inverter module 6 is suppressed to the forward voltage (VF) of the diode 55 or lower. Similarly, by the diodes 56 and 57 being mounted for the inverter modules 7 and 8, even if an induced voltage is generated by a parasitic inductance of the wiring, a surge voltage applied to the switching elements in the lower arms of the inverter modules 7 and 8 can be suppressed.

As described above, by the diodes 55, 56, and 57 being mounted between the control GNDs of the inverter modules 6, 7, and 8, and the power GNDs of the inverter modules, even if a surge voltage is generated in the GND wirings at the time of a switching operation of the switching elements 9a to 9f in the inverter modules, the application of the surge voltage to the switching elements 9d to 9f can be constricted, and so the occurrence of a failure and/or a malfunction of the switching elements in the inverter modules can be advantageously reduced.

Third Embodiment

Figure 6:
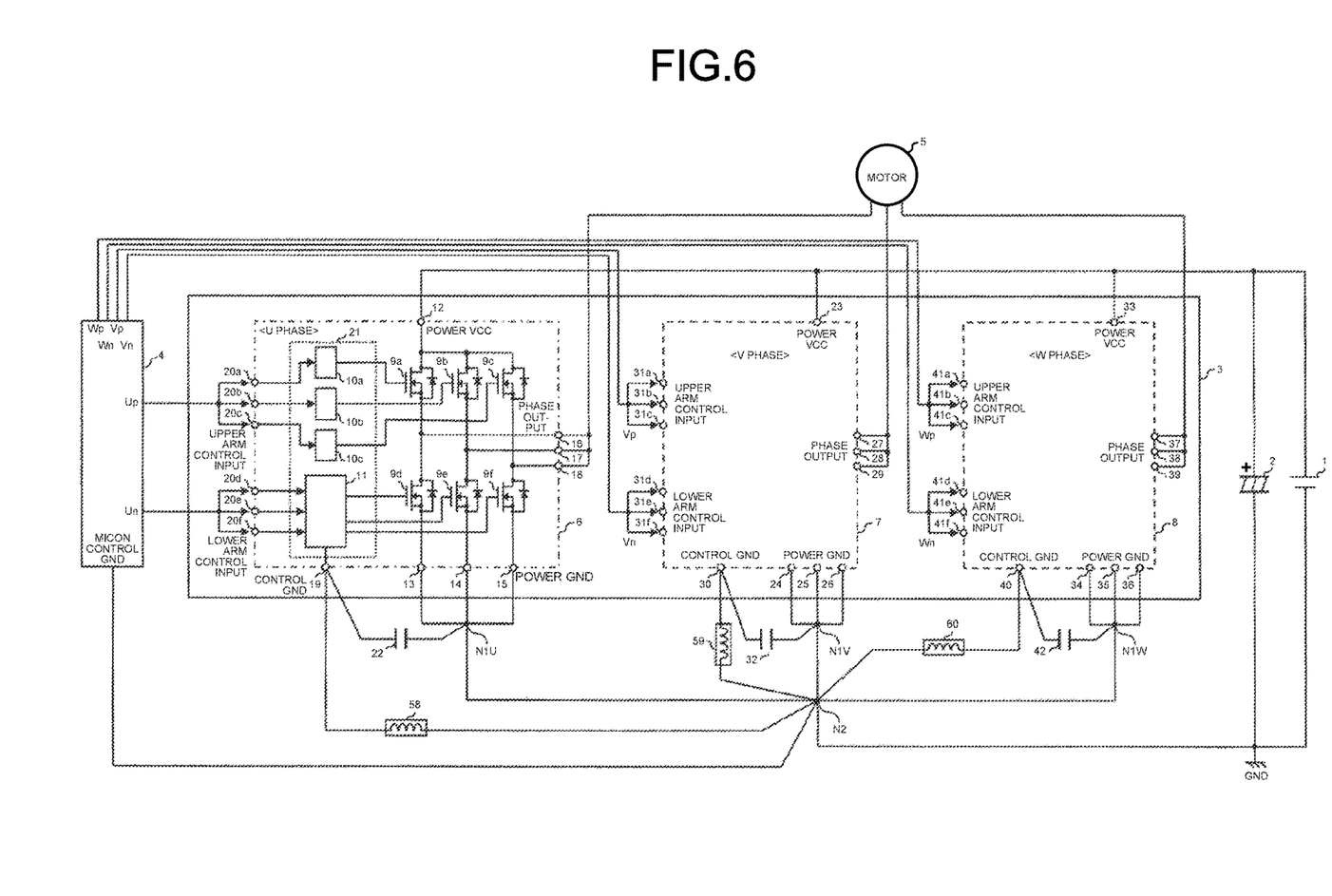
FIG. 6 is a diagram illustrating a system configuration including a motor drive apparatus according to a third embodiment.

The configuration and operation of a motor drive apparatus according to a third embodiment will be described with reference to the drawings. In the first embodiment, the capacitors 22, 32, and 42 are connected between the control GNDs and the power GNDs of the inverter modules, whereas in the present embodiment, ferrite bead inductors are further mounted additionally.

FIG. 6 illustrates a system configuration including the motor drive apparatus according to the present embodiment. In FIG. 6, a part identical or corresponding to a part in FIG. 1 will be assigned the same reference sign as that assigned to the part in FIG. 1. In the following, what is different from the first embodiment will mainly be described.

In the present system, the capacitor 22 is mounted between the control GND 19 of the inverter module 6 and the single connection point (N1U), and further a ferrite bead inductor 58 is mounted between the control GND 19 and the single connection point (N2). Likewise, as for the inverter modules 7 and 8, the capacitors 32 and 42 are connected between the control GNDs 30 and 40 of the inverter modules and the single connection points (N1V and N1W), respectively, and further ferrite bead inductors 59 and 60 are mounted between the control GNDs 30 and 40, and the single connection point (N2), respectively. Note that a ferrite bead inductor can be considered as an equivalent circuit having an inductance component and a resistance component connected in series. Moreover, as with the first embodiment, the capacitors 22, 32, and 42 are desirably provided as close to the inverter modules 6, 7, and 8 as possible, respectively.

The operation will now be described. In the present embodiment, by the capacitor 22 being mounted as with the first embodiment, even if an induced voltage is generated by a parasitic inductance of the wiring between the single connection point (N1U) and the single connection point (N2) in association with a commutation operation according to change in on/off states of the switching elements in the inverter modules, it is possible to constrict a voltage applied between gates and sources of the switching elements 9d to 9f in the lower arm of the inverter module 6. In addition, the ferrite bead inductor 58 is mounted between the control GND 19 and the single connection point (N2), so that an L-C-R circuit is formed by a closed loop of "the single connection point (N2)→the ferrite bead inductor 58→the control GND 19→the capacitor 22→the single connection point (N1U)→the single connection point (N2)", thereby making it possible to apply part of the induced voltage caused by the parasitic inductance of the wiring to the ferrite bead inductor 58. Moreover, the resistance component of the ferrite bead inductor 58 serves as a damping resistance against LC resonance, and thus has an effect of reducing ringing of the surge voltage. As a result, the application of the surge voltage to the capacitor 22 can be further suppressed. With the reduction in the voltage applied to the capacitor 22, the surge voltage applied to the switching elements 9d to 9f is further suppressed.

A similar effect can be obtained for the inverter modules 7 and 8 with the ferrite bead inductors 59 and 60 being implemented therefor. Specifically, even if an induced voltage is generated in a parasitic inductance of the wiring between the single connection point (N1V or N1W) and the single connection point (N2), the application of the surge voltage to the capacitors 32 and 42 can be suppressed more significantly than when only the capacitors 32 and 42 are mounted. Accordingly, a surge voltage applied between gates and sources of the switching elements in the lower arms of the inverter modules 7 and 8 is more significantly suppressed.

As described above, by the capacitors 22, 32, and 42 are mounted between the control GNDs of the inverter modules 6, 7, and 8, and the power GNDs of the inverter modules while at the same time the ferrite bead inductors 58, 59, and 60 are mounted between the control GNDs and the single connection point (N2), even if a surge voltage is generated in the GND wiring at the time of a switching operation of the switching elements 9a to 9f in the inverter modules, the application of the surge voltage to the switching elements 9d to 9f can be further suppressed and the occurrence of a failure and/or a malfunction of the switching elements in the inverter modules can be reduced.

Fourth Embodiment

Figure 7:
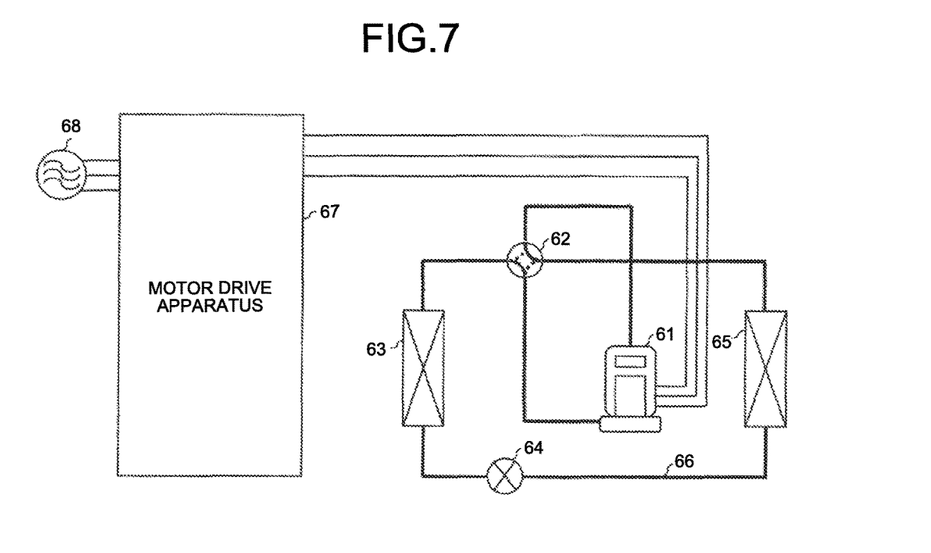
FIG. 7 is a diagram illustrating a configuration of an air conditioner according to a fourth embodiment.

FIG. 7 is a diagram illustrating the structure of an air conditioner equipped with the motor drive apparatus described in the first to third embodiments. The air conditioner of the present embodiment illustrated in FIG. 7 is a split type air conditioner that has a refrigeration cycle circuit in which a compressor 61, a four-way valve 62, an outdoor heat exchanger 63, an expansion valve 64, and an indoor heat exchanger 65 are set up via refrigerant piping 66. When the air conditioner performs a cooling operation, the outdoor heat exchanger 63 operates as a condenser while the indoor heat exchanger 65 operates as an expander. On the other hand, when the air conditioner performs a heating operation, the indoor heat exchanger 65 operates as a condenser while the outdoor heat exchanger 63 operates as an expander. The air conditioner is thus equipped with a refrigeration cycle device including the refrigeration cycle circuit in which the compressor, the condenser, the expander, and an evaporator are connected via the refrigerant piping.

A motor drive apparatus 67 is the motor drive apparatus described in any of the first to third embodiments. Note that the three-phase motor 5 described in the first to third embodiments is incorporated into the compressor 61. The DC voltage source 1 described in the first to third embodiments is constituted by a converter device that converts AC power inputted from an AC power supply 68 into DC power. A compression mechanism provided in the compressor 61 is operated by the three-phase motor 5 to compress a refrigerant. The refrigerant then exits the compressor 61 and circulates through the outdoor heat exchanger 63 and the indoor heat exchanger 65 to realize a refrigeration cycle that performs cooling and heating.

The air conditioner of the present embodiment includes the motor drive apparatus 67 described in the first to third embodiments, whereby the occurrence of a failure and/or a malfunction caused by a surge voltage can be reduced even if a motor current is increased greatly. Therefore, it is possible to provide the air conditioner that is adapted for large capacity power and capable of having the reduced occurrence of a failure and/or a malfunction thereof.

Note that the motor drive apparatus described in the first to third embodiments can be applied not only to an air conditioner but also to household electrical appliances or industrial equipment such as a refrigeration cycle device equipped with a refrigeration cycle circuit as well as a refrigerator, a freezer, a heat pump water heater, a showcase, and the like, which are installed with the refrigeration cycle device.

The invention claimed is:

1. A motor drive apparatus comprising the same number of inverter modules as the number of phases of a motor, the inverter modules each including: a plurality of switching element pairs each having a switching element for an upper arm and a switching element for a lower arm connected in series; a lower arm gate drive circuit to drive the switching elements for the lower arm; power ground terminals of the switching elements for the lower arm; and a control ground terminal of the lower arm gate drive circuit, wherein a surge suppression element to suppress a surge voltage generated at the time of switching of the switching elements is connected between the power ground terminals and the control ground terminal of the inverter module, the surge suppression element is connected between a first single connection point (N1) at which the plurality of power ground terminals of the inverter module are connected to each other, and the control ground terminal of the inverter module, and a second single connection point (N2) at which the first single connection points (N1) of each of the inverter modules and the control ground terminals of each of the inverter modules are connected to each other by wiring outside the inverter modules is provided.

2. The motor drive apparatus according to claim 1, wherein a plurality of phase outputs from the inverter module is coupled to form a phase output signal for one phase of the motor, and the lower arm gate drive circuit drives the switching elements for the lower arm on the basis of one and the same drive signal.

3. The motor drive apparatus according to claim 1, wherein the surge suppression element is a capacitor.

4. The motor drive apparatus according to claim 3, wherein a ferrite bead inductor is connected between the control ground terminal and the second connection point (N2).

5. The motor drive apparatus according to claim 1, wherein the surge suppression element is a diode, and an anode of the diode is connected to the control ground terminal while a cathode of the diode is connected to the power ground terminals or the first connection point (N1).

6. The motor drive apparatus according to claim 1, wherein the switching elements are made from a wide bandgap semiconductor material.

7. The motor drive apparatus according to claim 6, wherein the wide bandgap semiconductor material is silicon carbide (SiC), gallium nitride (GaN), or diamond.

8. A refrigeration cycle device comprising: the motor drive apparatus according to claim 1; and a refrigeration cycle circuit in which a compressor, a condenser, an expander, and an evaporator are connected via refrigerant piping.

9. An air conditioner comprising the refrigeration cycle device according to claim 8.

* * * * *